United States Patent [19]
Faddegon

[11] 4,353,028
[45] Oct. 5, 1982

[54] MEASURING CIRCUIT FOR INTEGRATING ELECTRICAL SIGNALS IN A GAMMA CAMERA

[75] Inventor: Hans Faddegon, Haarlem, Netherlands

[73] Assignee: U.S. Philips Corporation, New York, N.Y.

[21] Appl. No.: 102,697

[22] Filed: Dec. 12, 1979

[30] Foreign Application Priority Data

Dec. 18, 1978 [FR] France ............................... 78 35600

[51] Int. Cl.[3] ........................ G01R 19/00; G01T 1/20

[52] U.S. Cl. .................................... 324/111; 250/369; 324/99 D

[58] Field of Search ..................... 324/99 D, 120, 111; 340/347 AD, 347 NT; 250/369

[56] References Cited

U.S. PATENT DOCUMENTS 3,939,459 2/1976 Hoopes ............................ 324/99 D

*Primary Examiner*—Ernest F. Karlsen
*Attorney, Agent, or Firm*—Jack E. Haken

[57] ABSTRACT

A measuring circuit for integrating electrical signals. The measuring circuit comprises a delay line which is connected between the output of an integration stage and the input of a discharge stage in order to render the value of the discharge current dependent on a voltage which remains during said discharging. The circuit may also comprise a timing circuit which ensures that said constant voltage is maintained for a sufficiently long period of time. The measuring circuit may also comprise a circuit for advancing the opening a discharge switch in order to take into account the time required for transmitting the control signals for opening the discharge switch to this switch.

6 Claims, 10 Drawing Figures

MEASURING CIRCUIT FOR INTEGRATING ELECTRICAL SIGNALS IN A GAMMA CAMERA

Figure 1:
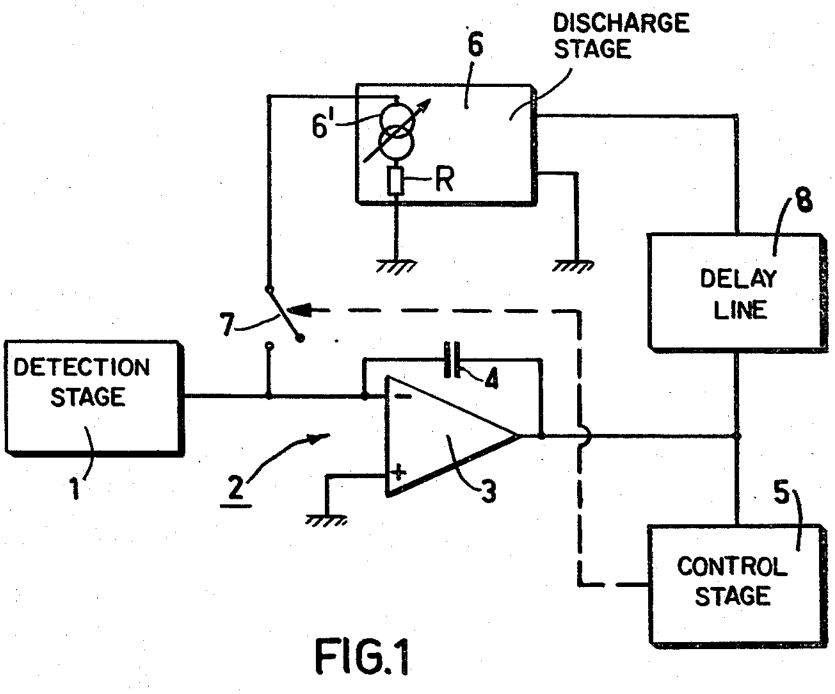

The invention relates to measuring circuits whose principle of operation is based on the integration of electrical signals applied to their input, a particularly interesting application of the invention being found in a gamma camera for the detection of gamma photons and for measuring the energy corresponding to the phenomena thus detected.

The invention notably relates to a measuring circuit which forms an essential part of said gamma camera and which is usually formed by an amplification and integration stage, the input of which is alternately connected to a detection stage and a discharge stage; said detection stage supplies the measuring circuit with a current which is representative of the signal to be measured, whilst the discharge stage supplies said measuring circuit with a reset current until the instant at which a level detection stage is activated to interrupt the discharging when it has been substantially completed.

In measuring circuits customarily used thus far the variation of the discharge curve is usually exponential; this has the following drawback: the duration of discharging (resetting) is comparatively long and is by no means complete. This type of discharge thus limits the use of the measuring circuit to the detection of signals whose period is sufficiently short to enable the discharge between two measurements. The residual charge detected after a measurement, moreover, can falsify later measurements. Obviously, a measuring circuit of this kind causes a loss of information which is larger as the mean interval between the successive signals to be measured is shorter, and it will also be obvious that the applications of such a measuring circuit remain limited.

An other type of circuit enabling a comparatively fast discharge is described in French Patent application No. 2,370,959. This application concerns a measuring apparatus in which the measuring circuit comprises a counter. When the discharge has not been completed at the instant of termination of a counting phase which started at the same instant as said discharge, the speed of said discharge is multiplied by a factor K thanks to the parallel connection of the first discharge current path and a second discharge current path. The operating speed of the circuit, however, remains bound to the amplitude of the integrated signal at the instant at which the discharge commences, so it varies with said amplitude: the operating speed decreases as the amplitude increases, so that a compromise must be found between on the one hand the expected maximum amplitudes at which the measuring circuit described in said application can function normally, and on the other hand the desired discharge speed.

Also known are systems (for example, the system described in German Patent application No. 2,260,120) in which the discharge takes place linearly with a constant current whose polarity is determined by determination of the polarity of the signal to be measured. Said system, however, also necessitates the described compromise between on the one hand the operating speed of the measuring circuit and on the other hand the maximum amplitude of the signals to be measured.

It is an object of the invention to provide a measuring circuit for integrating electrical signals in which the necessity of such a compromise is avoided as a result of the fact that the speed of the discharging of the integration stage of the circuit is ensured, regardless of the amplitude of the signal to be measured.

To this end, a measuring circuit in accordance with the invention is characterized in that it comprises a delay line which is connected between the output of the integration stage and the input of the discharge stage, the delayed output signal of the integration stage determining the value of the discharge current.

The connection between the integration stage and the discharge stage thus realized is equivalent to the parallel connection of the integration capacitor and a feedback loop in which the discharge current supplied by the discharge stage is proportional to the output voltage of the integration stage, but has been delayed by a given amount which is determined by the delay line. After completion of the charging of the integration capacitor, said output voltage is kept constant for a given period of time until the instant at which the discharging commences. When the delay introduced by the delay line is shorter than said period of time and when the discharge circuit is adapted so that the discharge time is shorter than or equal to said delay, the value of the discharge current is proportional to a constant voltage, and hence is also constant. Furthermore, as the charge stored in the integration stage is larger, the value of the discharge current is higher; therefore, the discharge period is not dependent of the amplitude of the signal to be measured. Finally, because the value of the discharge current is constant, the discharge voltage on the terminals of the integration capacitor passes through zero: the discharging is complete and no residual charge is present in the integration stage when a new measurement is started.

An embodiment of the measuring circuit in accordance with the invention is characterized in that the control stage comprises a comparator and a limiter circuit for limiting the charging and discharging periods of the integration stage, said limiter circuit comprising a monostable multivibrator for limiting the charging period, a monostable multivibrator for limiting the discharging period, and an AND-gate with a first input which is directly connected to the output of the comparator and a second input which is connected to the output of the series connected monostable multivibrators. The discharging can thus be controlled so that it ends no later than the end of a time interval which is assumed as a limit value.

When the limitation of the duration of the charge cycle and the discharge cycle of the measuring circuit is such that the output voltage of the intergration stage cannot reach a constant value after which it remains approximately constant for a period of time which at least equals the delay introduced by the delay line, the measuring circuit can be extended with a timing circuit in which said output voltage can be stored for the time being. After interruption of the charging, for example, by the opening of a switch which is connected in series between the output of the charging stage and the input of the integration stage, said timing circuit enables, in conjunction with the charging and discharging period limiting circuit, the discharge switch to be closed later with respect to the instant at which the charging terminates. The delay time is determined as a value which at least equals the period of time which the output voltage of the integration stage requires during the discharging in order to pass through zero for the first time under the influence of a constant discharge current. The output voltage of the integration stage thus remains constant for a sufficiently long period of time prior to the start of the discharge, whilst at the same time the value of the discharge current remains constant for a sufficiently long period of time, because said value is directly proportional to the voltage kept constant during the required period of time.

For further improvement of the measuring circuit in accordance with the invention, it can also be extended with a circuit for advancing the opening of the discharge switch in order to take into account the transmission time of the control signals to said discharge switch and to make the instant of opening of this switch coincide with the instant at which the output voltage of the integration stage passes through zero for the first time.

The invention will be described in detail hereinafter with reference to the accompanying diagrammatic drawing.

Figure 2A:
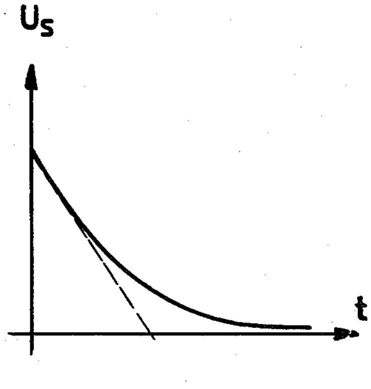
Figure 2B:
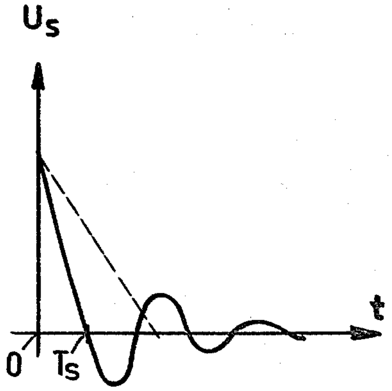
Figure 3:
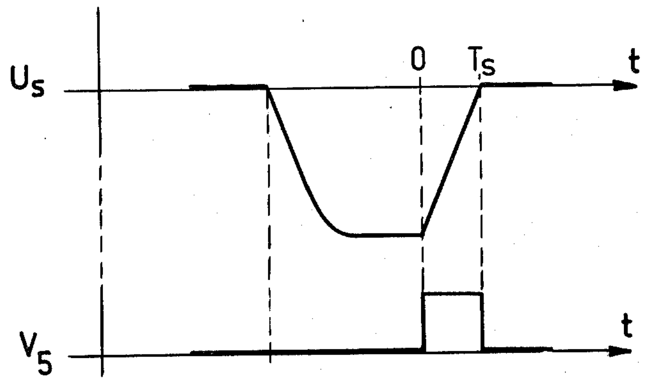
Figure 4:
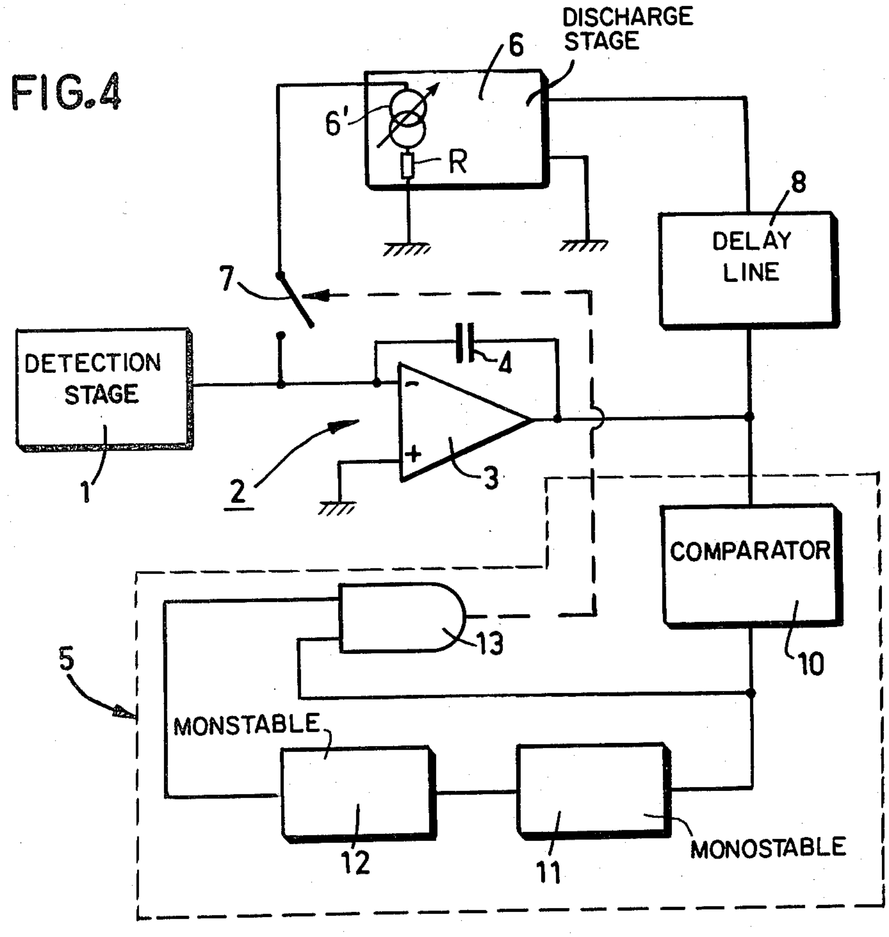
Figure 5:
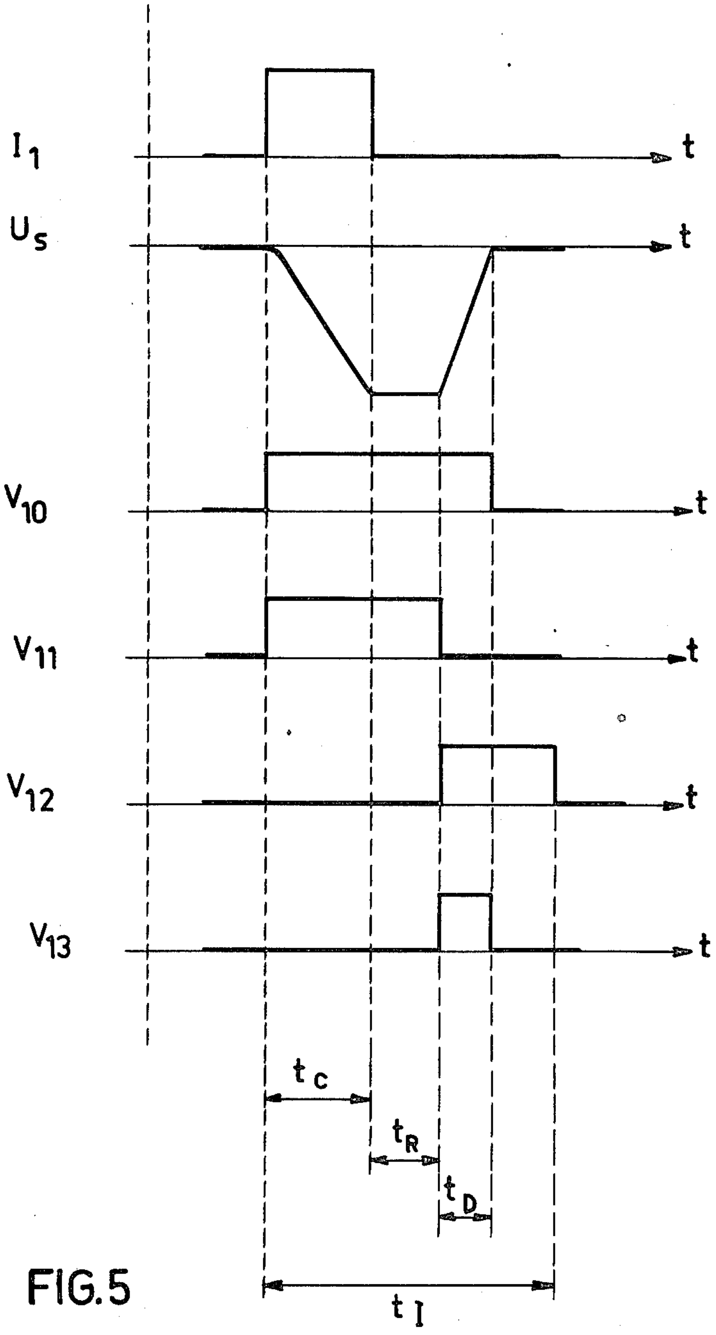
Figure 6:
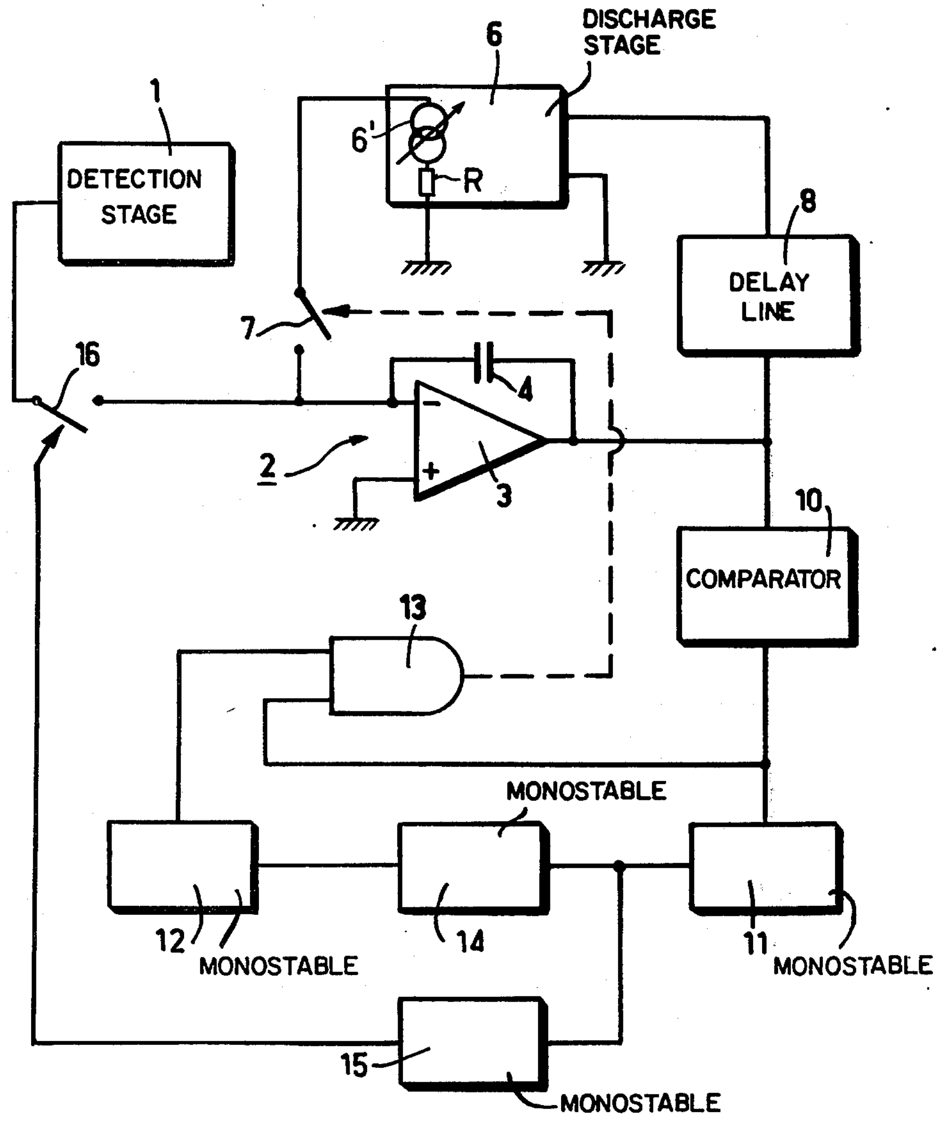
Figure 7:
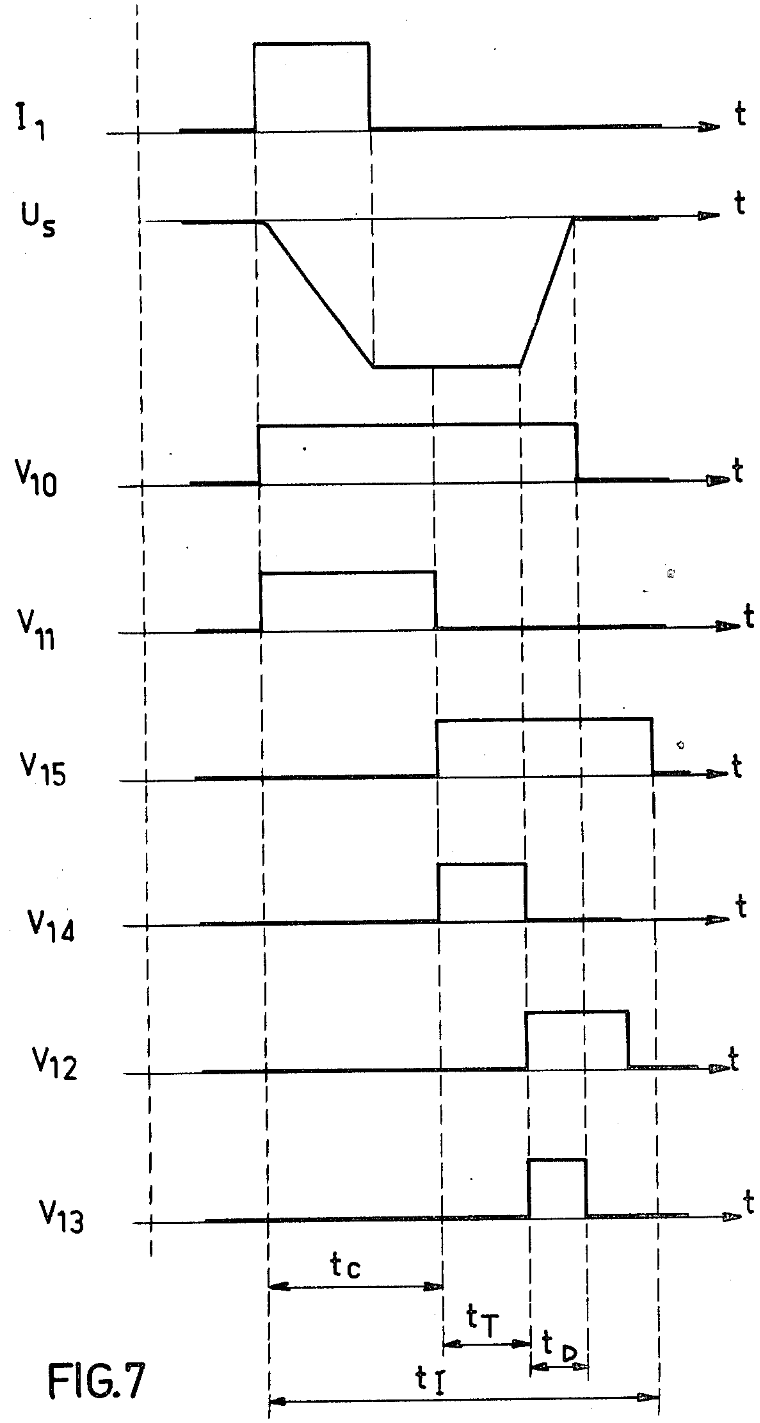
Figure 8:
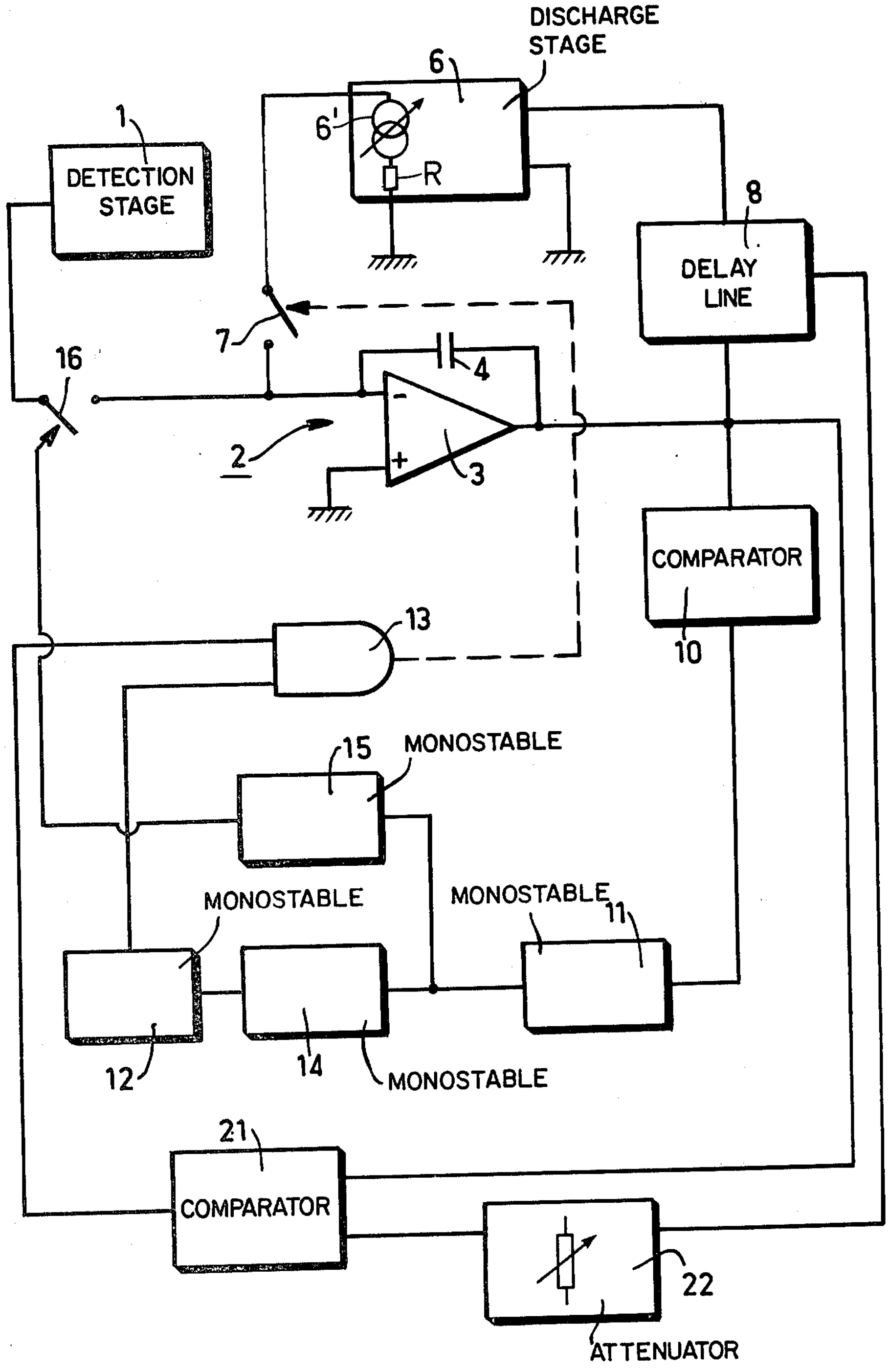
Figure 9:
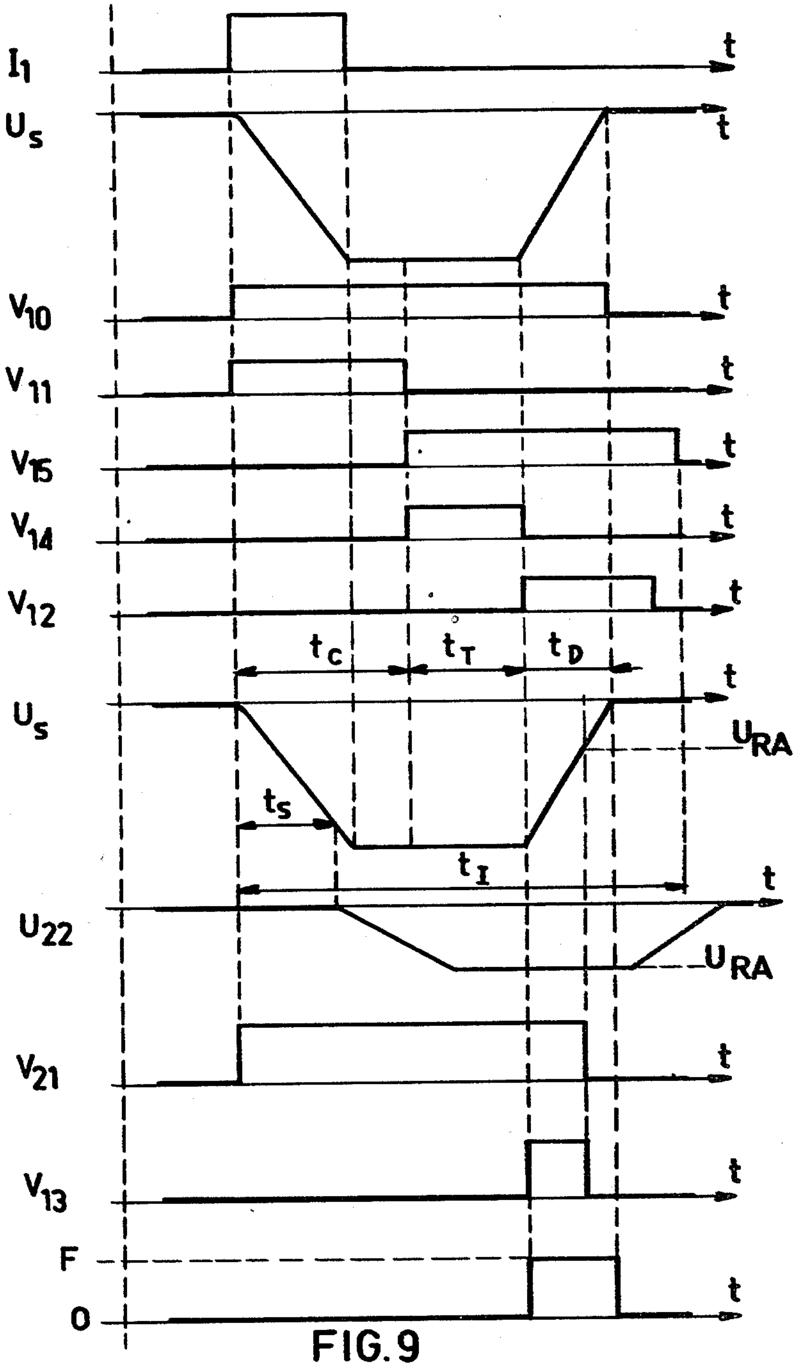

FIG. 1 shows a circuit diagram of a measuring circuit utilizing the basic idea of the invention, FIGS. 2a and 2b show the discharge curves in the absence and presence, respectively, of the delay line between the output of the integration stage and the input of the discharge stage, FIG. 3 illustrates the relationship between the output voltage of the control stage and the output voltage of the integration stage, FIGS. 4, 6 and 8 show a first, a second and a third, respectively, embodiment of the measuring circuit in accordance with the invention, and FIGS. 5, 7 and 9 show the output signals of the most essential elements of the measuring circuits shown in the FIGS. 4, 6 and 8, respectively.

The measuring circuit shown in FIG. 1 comprises a detection stage 1 which receives the signals to be successively measured and which converts these signals into an electrical charge current which is representative of these signals, an integration stage 2 which essentially comprises an operational amplifier 3 whose negative input receives the charge current and a capacitor 4, a control stage 5 whose input is connectedto the output of the integration stage 2, a discharge stage 6 including a voltage controlled current generator 6' which supplies said stage 2 with a current for resetting to zero, or a discharging current, during the period of closure of a switch 7 which is controlled by the control stage 5, and a delay line 8 which is connected between the output of the integration stage 2 control input of the current generator in the discharge stage 6. The signal to be measured which is received by the stage 1 originate from a known device which serves to convert a quantity to be measured into a corresponding electrical signal, said device being, for example, a photomultiplier tube in a gamma camera which converts scintillation light detected by said tube into electrical pulses.

The circuit shown in FIG. 1 operates as follows: thanks to the presence of the delay line 8 which imposes a delay on the discharge current which at least equals the duration of the discharge, said discharge current, whose value is bound to the output voltage $U_s$ of the integration stage 2 prior to the discharging, is not influenced by the decreasing value of said voltage $U_s$ during the discharge, but remains constant because it is bound to a constant voltage. The use of the feedback loop with the delay line 8 produces the following relationship between the value of the discharge current $I_D$ and that of the voltage $U_s$:

$$I_D = dU_s/dt = -U_s(t-t_R)/RC$$

Therein, $t_R$ is the delay introduced by the delay line 8, R is the valueof the internal resistance R of the current generator 6', formed by the discharge stage 6, and C is the capacitance of the integration capacitor 4 of the stage 2. Solution of the above differential equation results in a curve of the type shown in FIG. 2b, the first zero crossing of the output voltage $U_s$ occurring after a period of time which is smaller than the time constant, RC.

For comparison, FIG. 2a shows the discharge curve of the conventional type in the absence of a delay line: because the output voltage of the integration stage 2 decreases during the discharge, and because the discharge current is bound to this voltage, the discharging is exponentially damped and incomplete.

Due to the fact that the voltage $U_s$ is constant for a period of time $t_R$ preceding the start of the discharge in the measuring circuit in accordance with the invention, the value of the discharge current is also constant, at least until the instant $T_s$ of the first zero crossing of said value. At the instant $T_s$ the control stage 5 is activated to open the switch 7 and terminate the discharge (see FIG. 3 in which the output voltage $U_s$ of the integration stage 2 and the output voltage $V_5$ of the control stage 5 are shown).

The circuit thus formed comprises a feedback loop in which the value of the discharge current supplied by the stage 7 itself is constant because said current is proportional to a constant voltage. Because, moreover, the value of said current is proportional to the initial value of the voltage $U_s$ at the beginning of the discharge, the discharge period is not dependent of the amplitude of the signal to be measured. As a result, the operating speed of the proposed measurement circuit is very attractive, so that measurements can be performed at a very high rate.

In the embodiment shown in FIG. 4, the control stage 5 comprises a zero detector which is formed by a comparator 10, and a circuit for limiting the charging and discharging periods of the integration stage 2 (referred to hereinafter as period limiting circuit). Said period limiting circuit is connected between the output of the comparator 10 and the switch 7 and successively comprises: a monostable multivibrator 11 which is triggered at the same instant as the comparator 10 and which determines a maximum charge period, a monostable multivibrator 12 which is triggered under the influence of the output signal of the multivibrator 11 and which determines a maximum discharge period, and an AND-gate 13 having an input which is directly connected to the output of the comparator 10, its other input being connected to the output of the monostable multivibrator 12. The output of the AND-gate 13 controls the closing and opening of the switch 7, depending on whether the level of the signal present on said output is high or low.

The operation of the period limiting circuit is clearly illustrated in FIG. 5 which successively shows in dependence of the time: the electrical signal $I_1$ to be measured, the output voltage $U_s$ of the integration stage 2, the output voltage $V_{10}$ of the comparator 10, the output voltages $V_{11}$ and $V_{12}$ of the monostable multivibrators 11 and 12, and the output voltage $V_{13}$ of the AND-gate 13. In the described embodiment, the discharging of the capacitor 4 of the integration stage 2 occurs exclusively when the level of said voltage $V_{13}$ is high, which is the case only between the instant at which the voltage $V_{12}$ (output voltage of the monostable multivibrator 12) itself becomes high and the instant at which the voltage $V_{10}$ (output voltage of the comparator 10) becomes low. FIG. 5 also shows the values of the charging period tc, the delay $t_R$ imposed on the discharge by the delay line 8, and the discharge period $t_O$.

The presence of said circuit for limiting the period of the charging and the discharging cycle enables control of the discharge so that the discharge terminates at the latest at the end of a given time interval $T_I$ which is also stated in FIG. 5 and which is assumed as a limit for changing over, for example, to a further measurement. When the output voltage $U_s$ of the integration stage 2 has not been able to reach a value where it remains approximately constant for a period of time which at least equals $t_R$, the described measuring circuit is preferably extended as shown in FIG. 6 with a timing circuit in which said output voltage $U_s$ is stored for the required period of time. Said timing circuit, associated with the measuring circuit shown in FIG. 4, in addition to the components comprises two monostable multivibrators 14 and 15, the output signal of which becomes high when the output signal of the multivibrator 11 becomes low again. The instant at which the output signal of the multivibrator 14 becomes low again corresponds to the end of the storage period $T_R$ of the output voltage $U_s$ of the integration stage 2; when said signal becomes low again, the output signal of the multivibrator 12 becomes high again, thus starting the discharging of the capacitor 4 in that the output signal of the AND-gate 13 becomes high again. This output signal of the multivibrator 12 is applied to one of the inputs of the AND-gate 13, the other input of which receives the output signal of the comparator 10. When the voltage $U_s$ which decreases during the discharging becomes zero, the output signal of the comparator 10 becomes low again, thus terminating the discharging.

When the output signal of the multivibrator 15 becomes high, a switch 16 which is connected in series between the output of the charging stage 1 and the input of the integration stage 2 is opened. Said opening marks the beginning of the timing interval which separates the end of the charging of the capacitor 4 from the beginning of the discharging of the capacitor and which terminates when the output signal of the multivibrator 12 becomes low. The closing of the switch 16 occurs at the beginning of a new cycle for measuring an electrical signal.

The described operation of the timing circuit of FIG. 6 is clearly illustrated in FIG. 7 in which, like in FIG. 5 concerning the circuit shown in FIG. 4, the variation of the output signals of the main components of the measuring circuit is successively shown, i.e. the variation of the signal $I_1$ to be measured, of the output voltage $U_s$ of the integration stage 2, of the output voltage $V_{10}$ of the comparator 10, of the output voltages $V_{11}$, $C_{15}$, $V_{14}$, $V_{12}$ of the monostable multivibrators 11, 15, 14 and 12, and of the output voltage $V_{13}$ of the AND-gate 13. FIG. 7 also shows the values of the maximum charge period $t_e$, the duration $t_T$ of the timing interval (duration $t_T$ at least equal to the delay $t_R$ caused by the line 8), the discharge period $t_D$, and the maximum duration $t_I$ of the charging and discharging cycle.

In order to take into acccount the transmission times of the control signals to the discharge switch 7 and to synchronize the opening of said switch 7 exactly with the instant at which the output voltage $U_s$ passes through zero for the first time, the measuring circuit described with reference to FIG. 6 is extended, as shown in FIG. 8, with a circuit for advancing the opening of the discharge switch. Said circuit is notably associated with the period limiting circuit comprising the monostable multivibrators 11 and 12 and the AND-gate 13, and with the timing circuit comprising the monostable multivibrators 14 and 15; it comprises a comparator 21 and an attenuator 22. The first input of said comparator 21 directly receives the output voltage $U_s$ of the integration stage 2, the second input of said comparator 21 receiving a voltage $U_{22}$ which is derived from the voltage $U_S$ delayed by an amount $t_S$ in the delay line 8, followed by attenuation in the attenuator 22 which comprises, for example, an adjustable potentiometer. The output voltage of the comparator 21 is applied to the second input of the AND-gate 13, the first input of which is connected, as previously, to the output of the monostable multivibrator 12.

It is thus achieved that, by a linear decrease during the discharging of the capacitor 4, the output voltage $U_S$ of the integration stage 2 assumes a value which is equal to the maximum value $U_{RA}$ of $U_{22}$ (to be adjusted by means of the potentiometer), and that the comparator 21 changes its state and supplies, via its output, a command signal for opening the discharge switch 7. The delay $t_S$ caused by the delay line 8 is adjusted so that the time interval between the transition of the output signal of the comparator 21 to the low level and the first zero crossing of the voltage $u_S$ just equals the propagation time of the signal for opening the switch 7, said time being determined, for example, experimentally. The switch 7 is thus opened at the instant at which the voltage $U_s$ has exactly the zero value and the discharging of the capacitor 4 is complete. There is no risk that at the end of a charging and discharging cycle the integration stage 2 contains a residual charge which might disturb the subsequent charging and discharging cycles.

The operation of the circuit shown in FIG. 8 is clearly illustrated by FIG. 9 which shows said output signals ($I_1U_s$, $V_{10}$, $V_{11}$, $V_{15}$, $V_{14}$, $V_{12}$) as well as the signals stated hereinafter: the output voltage $U_{22}$ of the attenuator 22, the maximum value $U_{RA}$ of which represents the threshold voltage of the comparator 21, the output voltage $V_{21}$ of said comparator 21, and the output voltage $V_{13}$ of the AND-gate 13. The last trace in FIG. 9 represents the actual closing period $t_D$ of the switch 7 in comparison with the period $t_D$ during which the output signal $V_{13}$ of the AND-gate 13 remains high.

The invention, of course, is not restricted to the embodiments shown and described in this specification; other embodiments and modes of operation can also be realized within the scope of the invention. In the measuring circuits shown in the FIGS. 4, 6 and 8, for example, a sample-and-hold circuit can be used instead of the delay line 8.

If the signals to be measured succeed each other in rapid succession, two (or more) measuring circuits in accordance with the invention may be connected in parallel. In that case, a multiplex circuit is required for the alternating distribution of the signals to be measured, so that successively one of the parallel measuring circuits performs the measurement of a given signal, whilst the other circuit provides an indication as regards the value of the signal related to the previous measurement, and vice versa.

It will also be clear that the invention also relates to an arbitrary apparatus for measuring electrical signals whose principle of operation is based on the integration of the signals applied to the input of such an apparatus and which comprises one or more measuring circuits in accordance with the invention as described in this specification.

What is claimed is:

1. In a circuit for measuring electric charge which is produced by a detection device, which circuit comprises charge integrating means having an input connected to receive current from the detection device, an output, and means for accumulating electric charge to produce a voltage at the output which is proportional to the integral of the current received at the input and discharge means having a control input and including a voltage controlled current source which is connected to discharge the means for accumulating charge upon the occurrence of a predetermined control condition and at a rate which is proportional to a voltage at the control input; the improvement comprising:

a delay line connected between the output of the integrating stage and the control input of the discharge means.

2. A circuit as claimed in claim 1 further comprising control means for limiting the duration of the periods during which the means for accumulating charge is charged and discharged, said control means comprising a comparator having an input connected to the output of the integrating means and an output for producing a positive logic level on its output whenever the voltage at the output of the integrating stage exceeds a predetermined level; a first monostable multivibrator having an input driven by the output of the comparator and a time constant equal to a maximum duration of the charging period; a second monostable multivibrator having its input connected to the output of the first monostable multivibrator and a time constant equal to a maximum duration of the discharge period; and an AND gate having a first input connected to the output of the comparator, a second input connected to the output of the second monostable multivibrator and an output which produces a binary control condition signal which causes the discharge means to discharge the means for accumulating charge when both inputs of the AND gate are positive.

3. A circuit as claimed in claim 2 further comprising switch means for connecting the detection device to the input of the integrating means and timer means connected to control the operation of the switch means which function to delay connection of the detection circuit to the integrating circuit for a predetermined interval after the means for accumulating has been discharged.

4. A circuit as claimed in claim 2 wherein control means include means for changing the state of the control condition signal at a predetermined time before the output of the integrating means passes through the predetermined level.

5. The circuit of any one of claims 1-4 wherein the integrating means comprise an operational amplifier and a capacitor connected in a feedback loop around said amplifier.

6. The circuit of claim 5 wherein the detection device comprises a gamma camera.

* * * * *